United States Patent
Arora et al.

(10) Patent No.: US 9,640,280 B1
(45) Date of Patent: May 2, 2017

(54) POWER DOMAIN AWARE INSERTION METHODS AND DESIGNS FOR TESTING AND REPAIRING MEMORY

(71) Applicant: Cadence Design Systems, Inc., San Jose, CA (US)

(72) Inventors: Puneet Arora, Noida (IN); Navneet Kaushik, Delhi (IN); Steven Lee Gregor, Owego, NY (US); Norman Card, Vestal, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/930,316

(22) Filed: Nov. 2, 2015

(51) Int. Cl.
| | | |
|---|---|---|
| *G01R 31/317* | (2006.01) | |
| *G11C 29/38* | (2006.01) | |
| *G01R 31/3177* | (2006.01) | |
| *G11C 29/10* | (2006.01) | |
| *G11C 29/12* | (2006.01) | |
| *G06F 17/50* | (2006.01) | |

(52) U.S. Cl.
CPC ......... *G11C 29/38* (2013.01); *G01R 31/3177* (2013.01); *G06F 17/5081* (2013.01); *G11C 29/10* (2013.01); *G11C 29/12* (2013.01)

(58) Field of Classification Search
CPC ......... G11C 29/38; G11C 29/10; G11C 29/12; G01R 31/3177; G06F 17/5081
See application file for complete search history.

(56) References Cited

U.S. PATENT DOCUMENTS

| | | | | |
|---|---|---|---|---|
| 6,408,413 | B1* | 6/2002 | Whetsel | G01R 31/318555 714/727 |
| 6,829,730 | B2* | 12/2004 | Nadeau-Dostie | G01R 31/318563 714/30 |
| 6,928,606 | B2* | 8/2005 | Savaria | G01R 31/318536 714/729 |
| 7,117,408 | B2* | 10/2006 | Dixit | G11C 29/50 365/201 |
| 7,546,570 | B2* | 6/2009 | Norman | G06F 15/17337 716/101 |
| 7,581,124 | B1* | 8/2009 | Jacobson | G11O 5/14 713/300 |
| 7,590,902 | B1* | 9/2009 | Tabatabaei | G01R 31/318572 714/724 |
| 8,190,931 | B2* | 5/2012 | Laurenti | G06F 11/3013 713/300 |
| 8,438,437 | B2* | 5/2013 | Jain | G01R 31/318547 714/726 |

(Continued)

Primary Examiner — Naum B Levin
(74) Attorney, Agent, or Firm — Schwegman Lundberg & Woessner, P.A.

(57) ABSTRACT

Aspects of the present disclosure involve insertion of power domain aware memory testing logic into integrated circuit designs to enable efficient testing of the memories embedded therein. In example embodiments, each power domain of the integrated circuit, and the memories included therein, are associated with dedicated test data register (TDR) set and instruction set. Each instruction set causes memory test logic circuitry in the integrated circuit to test the memories included in the corresponding power domain in parallel. Once testing of memories within a particular power domain is over, the test circuitry tests memories belonging to another power domain in parallel, and so on.

20 Claims, 5 Drawing Sheets

(56) References Cited

U.S. PATENT DOCUMENTS

| | | | | |
|---|---|---|---|---|
| 8,533,545 B2* | 9/2013 | Goyal | ............ | G01R 31/318558 |
| | | | | 714/726 |
| 8,621,125 B2* | 12/2013 | Clark | .................. | G06F 13/4256 |
| | | | | 710/105 |
| 8,839,057 B2* | 9/2014 | Hughes | .................. | G11C 29/16 |
| | | | | 714/718 |
| 9,037,928 B2* | 5/2015 | Kleveland | ............... | G11C 29/44 |
| | | | | 714/710 |
| 9,183,105 B2* | 11/2015 | Portolan | ........ | G01R 31/318558 |
| 2004/0193957 A1* | 9/2004 | Swoboda | .................. | G06F 8/41 |
| | | | | 714/30 |
| 2006/0123305 A1* | 6/2006 | Linam | .................... | G01R 31/11 |
| | | | | 714/744 |
| 2008/0307240 A1* | 12/2008 | Dahan | ....................... | G06F 1/06 |
| | | | | 713/320 |
| 2011/0099442 A1* | 4/2011 | Hales | ............. | G01R 31/318533 |
| | | | | 714/729 |
| 2012/0204069 A1* | 8/2012 | Hughes | .................. | G11C 29/16 |
| | | | | 714/718 |
| 2013/0173970 A1* | 7/2013 | Kleveland | ............... | G11C 29/44 |
| | | | | 714/710 |
| 2015/0082092 A1* | 3/2015 | Sarangi | .................... | G06F 11/27 |
| | | | | 714/30 |
| 2015/0349969 A1* | 12/2015 | Dworak | ................. | H04L 9/3278 |
| | | | | 380/28 |
| 2016/0259000 A1* | 9/2016 | Robbins | ......... | G01R 31/318555 |

* cited by examiner

POWER DOMAIN AWARE INSERTION METHODS AND DESIGNS FOR TESTING AND REPAIRING MEMORY

TECHNICAL FIELD

The subject matter disclosed herein relates to design and analysis of electrical circuits. In particular, example embodiments relate to power domain aware insertion methods and designs for testing and repairing memory.

BACKGROUND

Traditional approaches to testing, diagnosing and repairing on-chip memories involve a testing architecture that includes a 16-state state machine and at least four input/output (I/O) pins in the design. The memories are tested using memory built-in-self-test approach (MBIST), which utilizes a number of algorithms to test the memories. To ensure that no defects are present in the design, large number of algorithms are run to test the memories, which results in very long test-time for a chip.

In some instances, memories may be tested in parallel to reduce test time. However, with the abundance of memories present on a current chip, running all of them in parallel causes the chip to consume substantial amounts of power, which may damage or destroy the chip. Moreover, a large number of chip designs have multiple power domains out of which not all the domains are active at the same time. If memories are present in different power domains then a lot of extra isolation and/or retention logic is required to test these memories properly.

Some further approaches involve testing memories in a group in parallel, but in series with another group. This approach attempts to balance the test-time and power, but has a number of limitations. For example, with this approach, all the memories are still associated with a single set of test-data-registers (TDRs) included in the testing architecture. Each TDR in a set of TDRs acts as a scan chain and has an associated instruction. The loading and unloading of these TDRs (based on associated instructions) is performed at the frequency of the test clock input (TCK), which is relatively small, so it takes a long time to load and unload the TDRs. Furthermore, the loading and unloading of these TDRs is done quite frequently to schedule the memories, observe the results, and take appropriate actions, thereby increasing the test-time.

Moreover, if a chip has memories in different power domains then there exists no proper method to test the memories. For example, the memory testing logic may be inserted into the proper power domain, but when the memory testing logic is stitched in one set of TDRs crossing through all the power domains, state retention and isolation logic is required to make that work which is unnecessary overhead in terms of hardware.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure involve insertion of power domain aware memory testing logic into integrated circuit designs to enable efficient testing of the memories embedded therein. In example embodiments, memories present in different power domains are associated with different test data register (TDR) sets and different instruction sets, and only one instruction set is active at a time. In this manner, a unique instruction set for testing the memories of a power domain is provided for each power domain included in the integrated circuit. Memories belonging to one domain may be tested in parallel. Once their testing is over, memories belonging to another domain may be tested in parallel, and so on. By providing the ability to test memories associated with a particular domain (or instruction set) in parallel, these example embodiments achieve a shorter testing run-time. It shall be appreciated, however, that the methodologies disclosed herein are not limited to testing memories belonging to a single domain in parallel, and in other embodiments, memories present in a single domain may be tested in series or in various combinations of parallel and series. Further, the methodologies disclosed herein are not limited to testing memories using a different instruction set for each power domain, and in other embodiments, a single instruction set may be assigned to multiple different power domains.

Further, because only one instruction set can be active at any given time, the memory testing logic and corresponding TDR of each power domain are isolated from other power domains. Thus, no additional isolation or retention logic is needed to test the memories belonging to a particular domain, and the area overhead associated with memory testing is thereby reduced. Moreover, because only one instruction set can be active at any given time, only those memories that are associated with a particular instruction set can be tested in parallel, and as a result, this design achieves the technical effect of reducing the peak power consumption during testing. Additionally, the length of the TDR's is reduced when compared to traditional approaches because memories belonging to different domains have separate TDRs and, as a result, the load/unload time of the TDRs is reduced when compared to traditional approaches.

Figure 1:
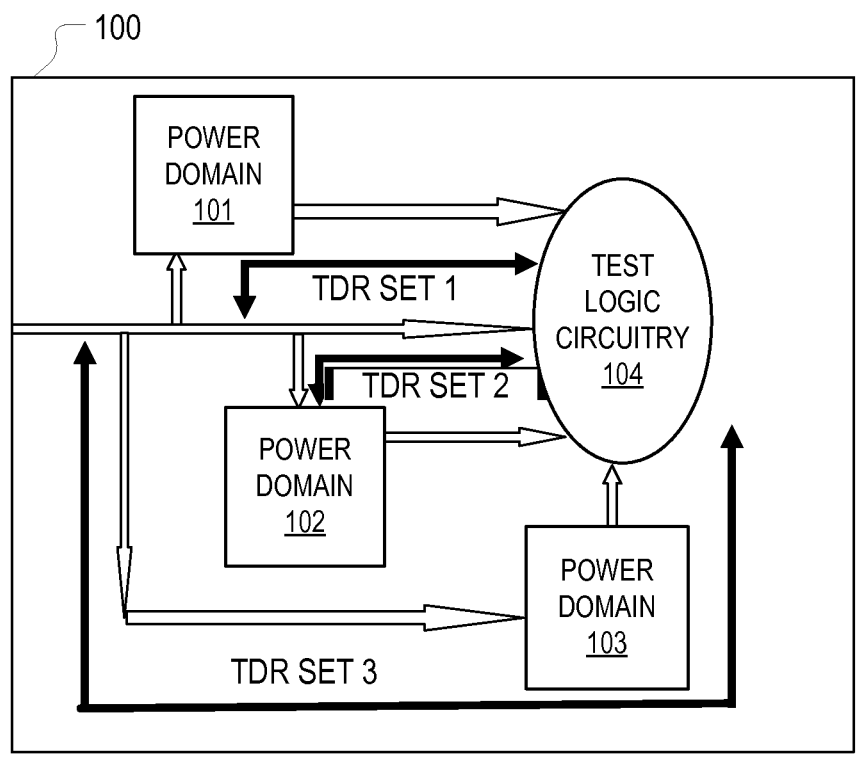
FIG. 1 is a block diagram illustrating a high level architecture of an integrated circuit, according to some example embodiments.

FIG. 1 is a block diagram illustrating a high level architecture of an integrated circuit 100, according to some example embodiments. Those of ordinary skill in the art may also refer to the integrated circuit 100 as an IC, chip, or microchip, and understand the integrated circuit 100 to be an example thereof. To avoid obscuring the inventive subject matter with unnecessary detail, various functional components of the integrated circuit 100 that are not germane to conveying an understanding of the inventive subject matter have been omitted from FIG. 1. However, a skilled artisan will readily recognize that various additional functional components may be included in the integrated circuit 100 to facilitate additional functionality that is not specifically described herein.

As shown, the integrated circuit 100 illustrated in FIG. 1 includes three power domains—namely, power domain 101, 102, and 103. Each of the power domains 101-103 is a collection of cells that each have a similar low-power behavior and control. The power domains 101-103 may be configured to be in communication with each other (e.g., via a bus or direct connections) so as to allow signals (e.g., information) to be passed between power domains or so as to allow the functional components with each power domain to share and access common data (e.g., stored data or data received as input). Further, each of the power domains 101-103 include, among other functional components, one or more machine-readable data storage units known as memories (e.g., semiconductor memory). Examples of memory types that may be included in each of the power domains 101-103 include computer memory, read-only memory, volatile memory, and non-volatile memory.

The integrated circuit 100 also includes a memory test logic circuitry 104 for testing the memories included in the power domains 101-103. Consistent with some embodiments, the memory test logic circuitry 104 may be provided in accordance with industry standards (e.g., IEEE 1149.1) and accordingly, the memory test logic circuitry 104 may correspond to a JTAG macro. The memory test logic circuitry 104 includes a standard interface through which test data logic and input control signals is communicated and uploaded by a memory testing machine (referred to hereinafter simply as a "tester"), and result data is communicated and downloaded by the tester. Further details of the memory test logic circuitry 104 and its standard interface, known as a test access port (TAP), are discussed below, in accordance with example embodiments, in reference to FIG. 2.

The memory test logic circuitry 104 includes multiple instruction sets, collectively forming memory test logic, for testing, diagnosing, and repairing the memory. Each instruction set includes multiple instructions, each of which relates to a particular function. More specifically, each instruction causes the memory test logic circuitry 104 to evaluate different aspects of the memory. For example, an instruction set may include a first instruction related to production testing, a second instruction related to diagnostic testing, and a third instruction related to repairing memory.

Each instruction set included in the memory test logic corresponds to one of the power domains 101-103 and, accordingly, the instructions included in each instruction set are specifically associated with memories in the corresponding power domain. By way of example, power domain 101 is associated with a first instruction set, power domain 102 is associated with a second instruction set, and power domain 103 is associated with a third instruction set. During testing, a power domain is active when the corresponding instruction set is active, and all other power domains are inactive. Thus, only one instruction set is activate at any given time, and as such, only one power domain is active at any given time. Moreover, all memories present in a power domain are tested in parallel.

Memories present in each of the power domains 101-103 are also associated with a different isolated set of test data registers (TDR). In other words, the set of TDRs associated with one power domain is separate and distinct from the set of TDRs associated with another power domain. For example, as illustrated in FIG. 1, power domain 101 is associated with TDR set 1, power domain 102 is associated with TDR set 2, and power domain 103 is associated with TDR set 3. Each set of TDRs is a machine-readable storage unit that stores a result of the execution of the instruction set on the memories of the corresponding power domain in the form of result data. Each TDR within a TDR set corresponds to a particular instruction within an instruction set. Following the example form above, TDR set 1 stores a result of the execution of instruction set 1 on the memories of power domain 101, TDR set 2 stores a result of the execution of instruction set 2 on the memories of power domain 102, and TDR set 3 stores a result of the execution of instruction set 3 on the memories of power domain 103. The result data stored in the TDR sets 1, 2, and 3 during testing may be read by the tester via the interface of the memory test logic circuitry 104.

During testing of the memories included in the integrated circuit 100, only a single instruction set from the test data logic is active at a time. In this way, only memories associated with a particular instruction (e.g., all memories included in a particular power domain) are tested in parallel. As a result, the peak power consumption of the integrated circuit 100 during testing is reduced, and the length of the TDRs is shorter when compared to traditional methods that utilize a single TDR set because memories belonging to different domains have their own dedicated TDR set.

Figure 2:
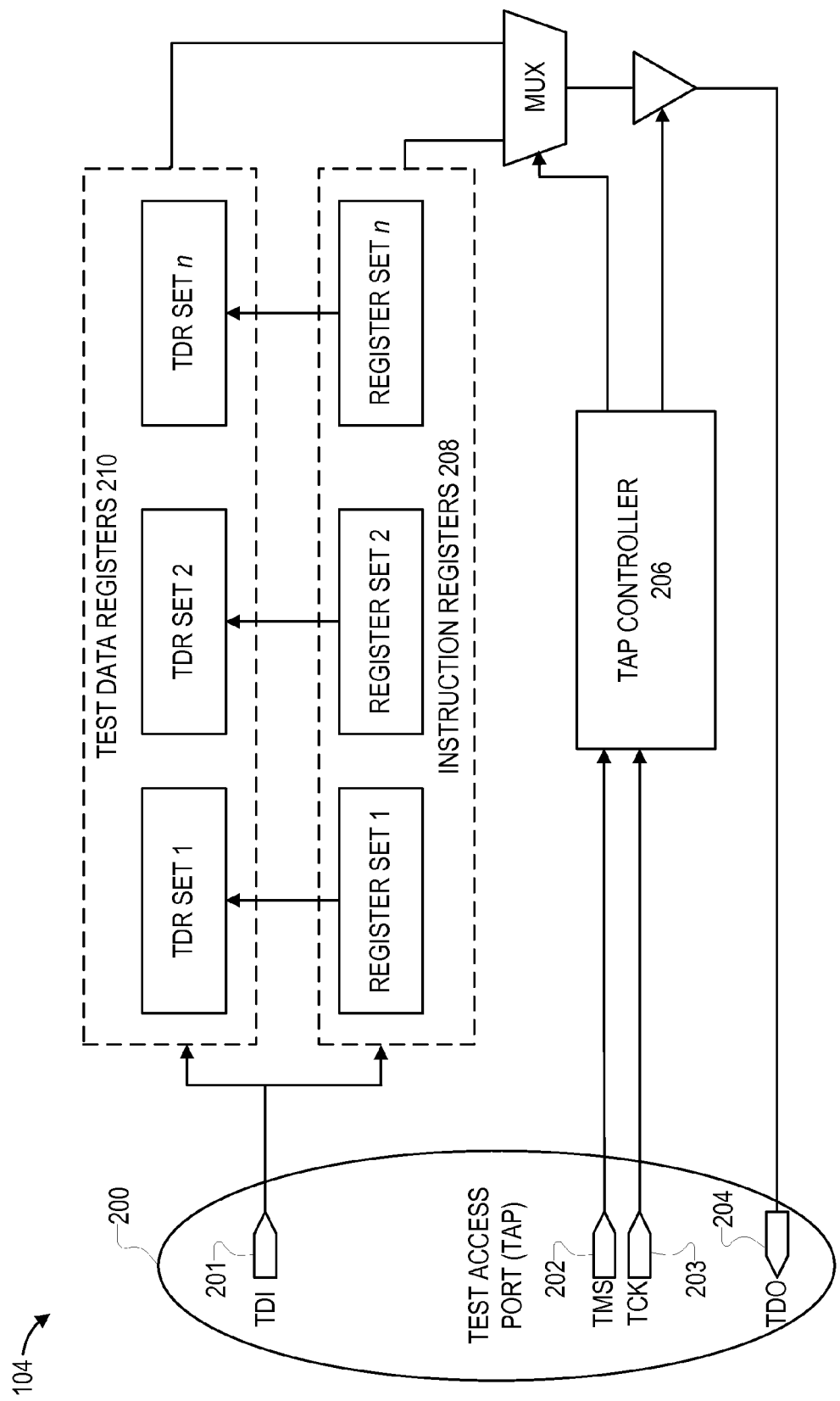
FIG. 2 is block diagram illustrating functional components of a memory test logic circuitry, which is provided as part of the integrated circuit, according to some example embodiments.

FIG. 2 is block diagram illustrating functional components of the memory test logic circuitry 104, which is provided as part of the integrated circuit 100, according to some example embodiments. The memory test logic circuitry 104 allows test instructions, collectively comprising memory test logic, and associated test data to be fed into a component and subsequently allows the results of execution of the test instructions to be read out in the form of result data. As shown, the memory test logic circuitry 104 includes a test access port (TAP) 200 that provides an interface to the memory test logic circuitry 104. The TAP 200 includes I/O pins 201-204, which are dedicated pins used with the memory test logic. More specifically, pin 201 is referred to as the test data input (TDI) pin, which is configured to receive a serial input control signal for test data logic (e.g., one or more instruction sets); pin 202 is referred to as the test mode select (TMS) pin, which is configured to receive serial input for test logic control bits; pin 203 is referred to as the test clock input (TCK) pin, which is a dedicated test logic clock used serially to shift test instructions, test data, and control inputs on the rising edge of the clock, and serially to shift the output data on the falling edge of the clock; and pin 204 is referred to as the test data output (TDO) pin, which is configured to provide serial output for test instruction and result data resulting from the execution of the memory test logic. In some embodiments, the memory test logic circuitry 104 may further include an additional test reset (TRST) pin that may be used to reset the memory test logic.

As shown, input received by the pins 202 and 203 (e.g., TMS and TCK) is provided as input to a TAP controller 206. The TAP controller 206 is a 16-state state machine configured to receive the two control inputs (e.g., TMS 202 and TCK 203) and generate control and clock signals for the rest of the memory test logic circuitry 104 architecture. Upon power up, the TAP controller 206 enters a reset state, and after reset, the TAP controller 206's state changes at the rising edge of TCK 203 based on the value of TMS 202.

Instruction sets may be received as input by the pin 201, and stored in the instruction registers 208. More specifically, each instruction set that may be received as input corresponds to a specific power domain (e.g., one of the power domains 101-103) of the integrated circuit 100, and instruction may be loaded serially into a dedicated register set included in the instruction registers 208. Once an instruction or instruction sets has been loaded into the instruction registers 208, the memory test logic circuitry 104 is configured to respond. A subsequent instruction may then be loaded, which then configures the memory test logic circuitry 104 to respond to the subsequent instruction. In some instances, test data may also be loaded, via pin 201, into the memory test logic circuitry 104 to provide a more meaningful response. The test data may be serially loaded into the memory test logic circuitry 104 in a similar manner to the process used previously to load the multiple instruction sets. Execution of each instruction set results in data, referred to as result data, to be loaded into TDRs 210. More specifically, each instruction set corresponds to a particular isolated TDR set, and accordingly, the result data associated with the execution of instructions from a particular instruction set are loaded into the TDR set corresponding to the particular instruction set. As an example, a first instruction set loaded into register set 1 corresponds to TDR set 1, and thus, the result data associated with the execution of the first instruction set is stored in the TDR set 1.

After execution, by the memory test logic circuitry 104, of each test instruction included in a given instruction set, the results of the test can be examined by shifting data out of the corresponding TDR set or through TAP controller 206. Operation of the memory test logic circuitry 104 may proceed by loading and executing several further instructions in a manner similar to that described and would conclude by returning the memory test logic circuitry 104 and, in some instances, on-chip system circuitry to its initial state.

Figure 3:
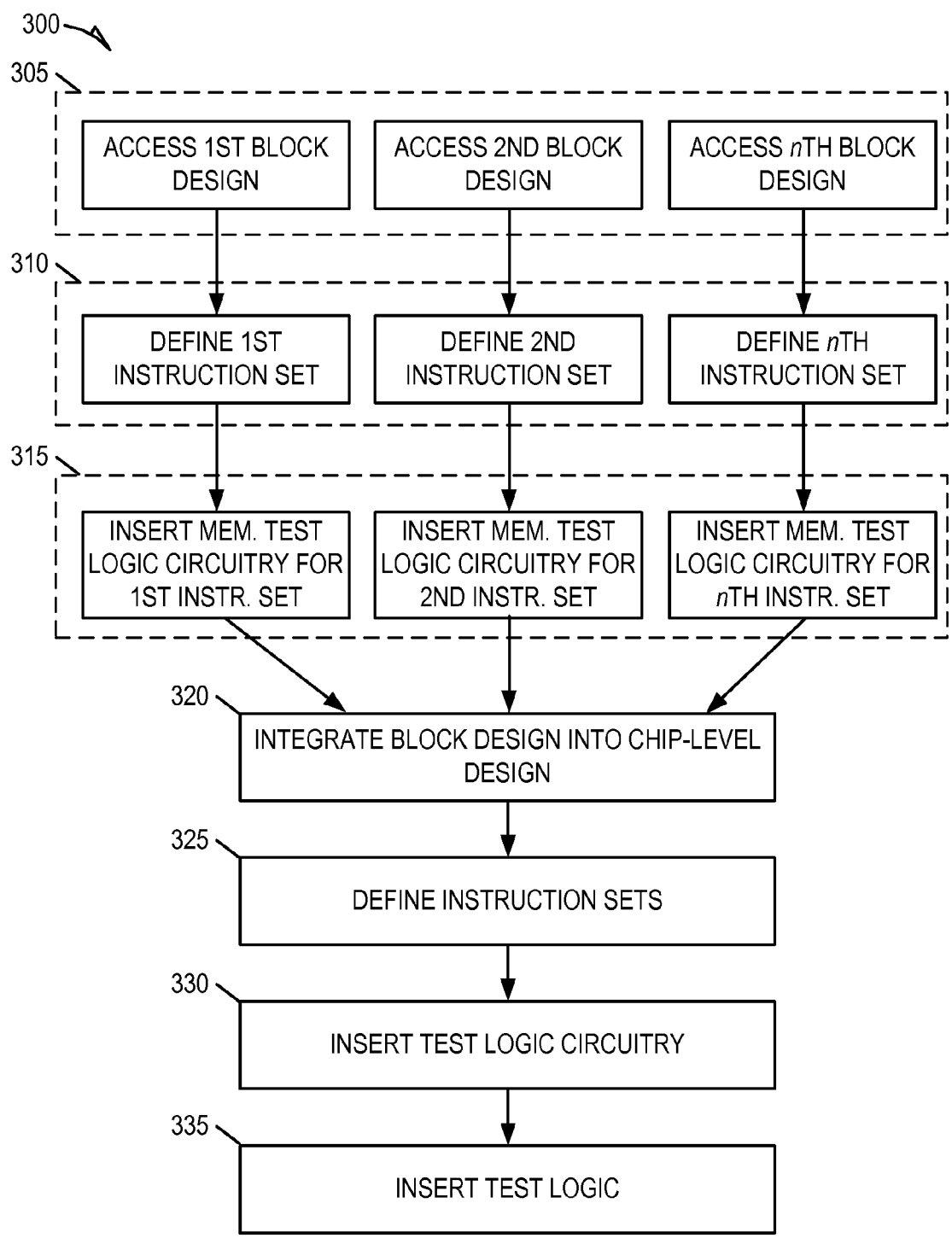
FIG. 3 is a flow chart illustrating a method for inserting power domain aware memory test logic into an integrated circuit, according to some example embodiments.

FIG. 3 is a flow chart illustrating a method 300 for inserting power domain aware memory test logic into a chip-level design (e.g., a chip-level design of the integrated circuit 100), according to some example embodiments. The method 300 may be performed by a circuit designer or other individual using standard circuit design and synthesis tools (e.g., design and synthesis software tools). Operation 305 includes accessing a first block design that does not include test data logic. The first block design may be embodied in a data object or other data structure accessed from a computer-readable medium (e.g., a hard drive) in communication with the circuit design and synthesis software tool. The first block design includes a plurality of memories and other functional components that form a portion of the chip-level design. More specifically, the first block design represents the logic associated with a first power domain in the chip-level design. For example, the first block design may correspond to the power domain 101 of integrated circuit 100.

Operation 310 includes defining a first instruction set. The first instruction set may be defined using an appropriate command provided by the circuit design and synthesis software tool being employed. The first instruction set is associated specifically with the first block design and, in this way, the instruction set is specifically associated with the first power domain represented by the first block design. The first instruction set includes multiple instructions related to different functions for evaluating memories present in the first power domain. For example, for the integrated circuit 100, the first instruction set includes multiple instructions related to different functions for evaluating memories included in the power domain 101.

Operation 315 includes inserting memory test logic circuitry for the first instruction set into the first block design. As shown, the method 300 includes performing the operations 305, 310, and 315 for a second-nth block designs such that a second-nth memory test logic circuitry are inserted into second-nth blocks for instruction sets associated with the second-nth power domains, respectively. The result of the execution of the operations 305, 310, and 315 for the first-nth block designs results in a plurality of block designs with embedded test data logic.

Operation 320 includes integrating the plurality of block designs with embedded test data logic into the chip-level design. For example, the memory test logic inserted blocks need to be connected together so that they can be tested from the external chip level ports (e.g., those provided by the TAP 200).

Operation 325 includes specifying the plurality of instruction sets included in the chip-level design. The plurality of instruction sets specified as part of operation 325 correspond to the first-nth instruction sets defined at operation 310 as part of the block design. The plurality of instruction sets defined at operation 325 are included as part of a test logic circuit (e.g., memory test logic circuitry 104) that is inserted into the chip-level design.

Operation 330 includes inserting the test logic circuit into the chip-level design of the integrated circuit 100. Operation 330 also includes inserting memory test logic comprising the plurality of instruction sets into the test logic circuit. Operation 335 includes inserting memory test logic for the memories (if present at the chip level) and connecting the memory test logic circuitry with all inserted memory test logic. In some instances, the chip level design may include memories that are not part of the block level designs, and the inserting of the memory test logic includes inserting the applicable memory test logic for those memories. In some embodiments, the order of operations 330 and 335 may be reversed.

Figure 4:
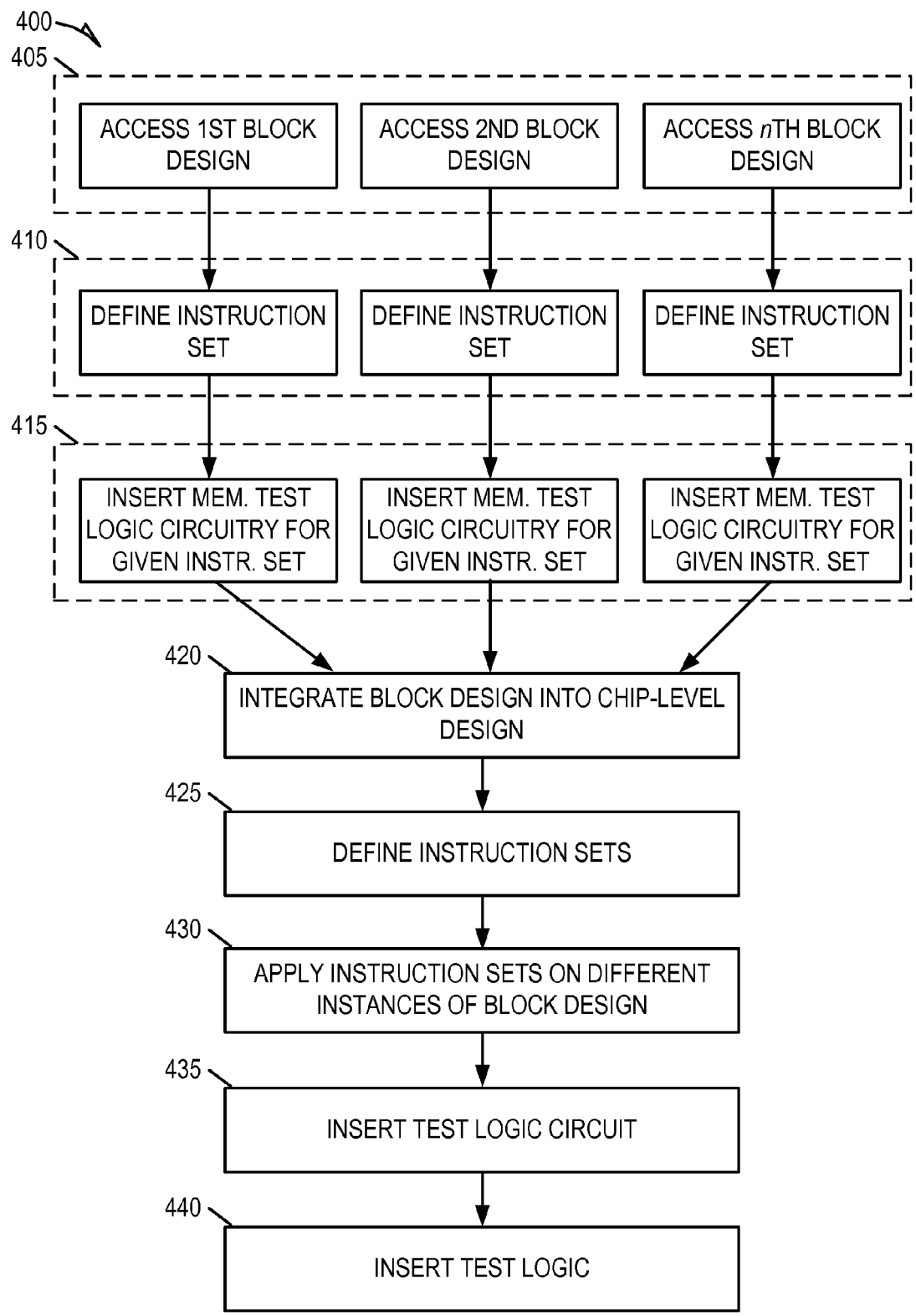
FIG. 4 is a flow chart illustrating a method for inserting power domain aware memory test logic into an integrated circuit, according to some alternative example embodiments.

The execution of method 300 results in a chip-level design having embedded power-domain aware memory test logic. Though the method 300 involves defining multiple instruction sets on different design blocks during the block design stage (e.g., operations 305, 310, and 315) and including the memory test logic inserted blocks in the chip-level design, in other embodiments, a single instruction set may be defined for insertion into every block design (e.g., first-nth block designs), and further instruction sets may be defined at the chip-level design so as to associate a different instruction set with each power domain in the chip-level design. For example, FIG. 4 is a flowchart illustrating a method 400 for inserting power domain aware memory test logic into a chip-level design (e.g., the chip-level design of the integrated circuit 100), according to some example embodiments. As with the method 300, the method 400 may be performed by a circuit designer or other individual using standard circuit design and synthesis tools (e.g., design and synthesis software tools).

Operation 405 includes accessing a first block design that does not include test data logic. The first block design may be embodied in a data object or other data structure accessed from a computer-readable medium (e.g., a hard drive) in communication with the circuit design and synthesis software tool. The first block design includes a plurality of memories and other functional components that form a portion of the integrated circuit 100. More specifically, the first block design represents the logic associated with a first power domain in the integrated circuit 100 (e.g., the power domain 101).

Operation 410 includes defining an instruction set. The instruction set may be defined using an appropriate command provided by the circuit design and synthesis software tool being employed. The instruction set includes multiple instructions related to different functions for evaluating memories.

Operation 415 includes inserting memory test logic circuitry for the given instruction set into the first block design. As shown, the method 400 includes performing the operations 405, 410, and 415 for a second-nth block design such that memory test logic circuitry is also inserted into second-nth blocks. The result of the execution of the operations 405, 410, and 415 for the first-nth block designs results is a plurality of block designs with embedded test data logic that includes the first instruction set.

Operation 420 includes integrating the plurality of block designs with embedded test data logic into the chip-level design. For example, the memory test logic inserted blocks need to be connected together so that they can be tested from the external chip level ports (e.g., those provided by the TAP 200).

Operation 425 includes defining a plurality of instruction sets to be included in the chip-level design. Each instruction set defined during operation 425 is specifically associated with a particular block design and, as such, each instruction set is specifically associated with a particular power domain of the integrated circuit.

Operation 430 includes applying the plurality of instruction sets to a particular block design so as to associate an instruction set with its corresponding power domain. For example, for the integrated circuit 100, a first instruction set may be applied to a first block design representing the power domain 101, a second instruction set may be applied to a second block design representing the power domain 102, and a third instruction set may be applied to a third block design representing power domain 103.

Operation 435 includes inserting the memory test logic circuitry 104 into the chip-level design, and inserting memory test logic comprising the plurality of instruction sets into the memory test logic circuitry 104 inserted into the chip-level design. Operation 440 includes inserting memory test logic for the memories (if present at the chip level) and connecting the memory test logic circuitry with all inserted memory test logic. In some instances, the chip level design may include memories that are not part of the block level designs, and the inserting of the memory test logic includes inserting the applicable memory test logic for those memories. In some embodiments, the order of operations 435 and 440 may be reversed. As with the method 300, execution of the method 400 results in a chip-level design having embedded power-domain aware memory test logic.

Figure 5:
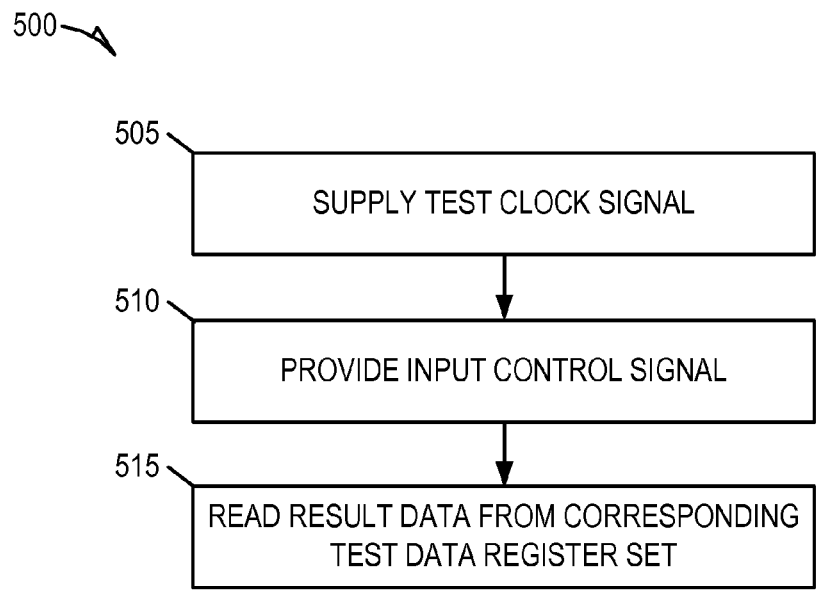
FIG. 5 is a flow chart illustrating a method for testing memory in a particular power domain of the integrated circuit, according to some alternative example embodiments.

FIG. 5 is a flow chart illustrating a method for testing memory in a particular power domain of the integrated circuit 100, according to some alternative example embodiments. The method 500 may be embodied in machine-readable instructions for execution by a hardware component (e.g., a processor) such that the operations of the method 500 may be performed by a specially configured machine. In particular, the operations of the method 500 may be performed in part or in whole by a memory testing machine and, accordingly, the method 500 is described below by way of example with reference thereto. However, it shall be appreciated that the method 500 may be deployed on various other hardware configurations.

At operation 505, the memory tester machine supplies the memory test logic circuitry 104 with a test clock signal via the pin 203 (e.g., the TCK pin). The test clock signal is used serially to shift test instructions, input control signals, and test data on the rising edge of the clock, and used serially to output result data on the falling edge of the clock.

At operation 510, the memory tester machine provides an input control signal to the memory test logic circuitry 104 via the pin 201 (e.g., the TDI pin) of the TAP 200. The input control signal instructs memory test logic circuitry 104 to execute instruction sets from the multiple instruction sets forming the memory test logic, and to read result data from the applicable TDR set. Each instruction set corresponds to a particular power domain (e.g., one of the power domains 101-103) of the integrated circuit 100, and each instruction set has an associated TDR set that is isolated from TDR sets associated with other instruction sets. Execution of a particular instruction set causes the memory test logic circuitry 104 to evaluate all memories belonging to the power domain associated with the instruction set in parallel. During execution of a particular instruction set, the power domain associated with the particular instruction set is active while all other power domains are inactive. The result of the evaluation of the memories is output as result data to the TDR set associated with the particular instruction set.

At operation 515, the memory tester machine reads the result data from the TDR set associated with execution of the instruction set(s) involved in the input control signal. The memory tester machine reads the result data by serially shifting data out of the TDR set. The memory tester machine may then provide the result data to a user (e.g., as a digital representation or physical print-out) for inspection or comparison with expected results. In some embodiments, the method 500 may be repeated such that the memory test logic circuitry 104 is provided with an additional input control signal instructed to execute a different instruction set on memories from a different power domain, and this process my continue until memories in all power domains have been evaluated.

In some instances, the input control signal may instruct the memory test logic circuitry 104 to serially execute two or more instruction sets such that only one instruction set is active at a time, and thus, only one power domain is active at a time. In this manner, the sets of memories included in each power domain are evaluated in series although all the memories of a set (e.g., all memories in a particular power domain) are tested in parallel.

As an example of the application of method 300, as illustrated in FIG. 1 the integrated circuit 100 includes three power domains—power domains 101-103, and accordingly, the memory test logic inserted into the memory test logic circuitry 104 includes three instructions sets and three test data register sets. Each instruction set corresponds to one of the test data register sets. In providing the input control signal to the memory test logic circuitry 104, the tester machine may instruct the memory test logic circuitry 104 to execute the first instruction set and, in response, the memory test logic circuitry 104 evaluates the memories included in the first power domain using the first instruction set. The first power domain is active during evaluation of the memories included in the first power domain while the second and third power domains remain inactive. The results of the evaluation of the memories included in the first power domain are loaded into and are read from the first TDR set, which is isolated from the second and third TDR sets. The process may be similarly repeated for the second and third instructions sets associated with the second and third power domains, respectively, or the first input control signal may instruct the memory test logic circuitry 104 to execute the three instruction sets in series.

Electronic Apparatus and System

Example embodiments may be implemented in digital electronic circuitry, in computer hardware, firmware, or software, or in combinations of them. Example embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

Language

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store instructions. The term "machine-readable medium" shall also be taken to include any medium, or combination of multiple media, that is capable of storing instructions for execution by a machine, such that the instructions, when executed by one or more processors of the machine, cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The various operations of example methods described herein may be performed, at least partially, by one or more processors that are temporarily configured (e.g., by software) or permanently configured to perform the relevant operations. Similarly, the methods described herein may be at least partially processor-implemented. For example, at least some of the operations of a method may be performed by one or more processors. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A system comprising:
   an integrated circuit comprising a plurality of power domains, each power domain including a plurality of memories; and a memory test logic circuitry embedded in the integrated circuit, the memory test logic circuitry including a memory test logic and a plurality of test data register (TDR) sets, the memory test logic including a first instruction set associated with a first power domain of the integrated circuit and a second instruction set associated with a second power domain of the integrated circuit, the first instruction set, when executed by the test logic circuit, causing the memory test logic circuitry to:
evaluate a first set of memories included in the first power domain, and store a first result data set in a first TDR set based on a result of the evaluation, the first TDR set corresponding to the first power domain, and the second instruction set, when executed by the memory test logic circuitry, causing the memory test logic circuitry to:
evaluate a second set of memories included in the second power domain, and store a second result data set in a second TDR set based on a result of the evaluation of the second set of memories, the second TDR set corresponding to the second power domain of the integrated circuit.

2. The system of claim 1, wherein the memory test logic circuitry further includes a test access port (TAP) configured to receive an input control signal, the control signal instructing the memory test logic circuitry to execute the first and second instruction sets.

3. The system of claim 1, wherein the input control signal causes the test logic circuit to serially execute the first and second instruction sets.

4. The system of claim 1, wherein the first power domain is active during execution of the first instruction set.

5. The system of claim 4, wherein the second power domain is inactive during execution of the first instruction set.

6. The system of claim 1, wherein the first instruction set causes the first set of memories to be evaluated in parallel.

7. The system of claim 1, wherein the first TDR set associated with the first power domain is isolated from the second TDR set associated with the second power domain.

8. The system of claim 1, wherein the test data logic further includes a third instruction set associated with a third power domain, the third instruction set, when executed by the memory test logic circuitry, causes the test data logic circuitry to perform operations comprising:
evaluate a third set of memories included in the third power domain, and store a third test data set in a third test data register based on a result of the evaluation of the third set of memories, the third test data register corresponding to the third power domain of the integrated circuit.

9. A method comprising:
providing, using one or more processors, a input control signal to a memory test logic circuitry of an integrated circuit, the integrated circuit including a plurality of power domains, the input control signal causing the memory test logic circuitry to execute a memory test logic included in the memory test logic circuitry, the memory test logic including a first instruction set associated with a first power domain of the integrated circuit and a second instruction set associated with a second power domain of the integrated circuit, the first instruction set, when executed by the memory test logic circuitry, causing the memory test logic circuitry to:
evaluate a first set of memories included in the first power domain, and store a first result data set in a first TDR set based on a result of the evaluation, the first TDR set corresponding to the first power domain, and the second instruction set, when executed by the memory test logic circuitry, causing the memory test logic circuitry to:
evaluate a second set of memories included in the second power domain, and store a second result data set in a second TDR set based on a result of the evaluation of the second set of memories, the second TDR set corresponding to the second power domain of the integrated circuit.

10. The method of claim 9, further comprising:
reading, via the test access port, the first set of result data from the first test data register; and
reading, via the test access port, the second set of result data from the second test data register.

11. The method of claim 9, wherein the input control signal causes the memory test logic circuitry to serially execute the first and second instruction sets.

12. The method of claim 11, wherein the test logic circuitry serially executing the first and second instructions sets causes the memory test logic circuitry to evaluate the first and second set of memories in series.

13. The method of claim 9, herein the first power domain is active during execution of the first instruction set.

14. The method of claim 13, wherein the second power domain is inactive during execution of the first instruction set.

15. The method of claim 9, wherein the first instruction set causes memories within the first set of memories to be evaluated in parallel.

16. The method of claim 13, wherein the first TDR set associated with the first power domain is isolated from the second TDR set associated with the second power domain.

17. The method of claim 9, wherein the test logic further includes a third instruction set associated with a third power domain, the third instruction set, when executed by the memory test logic circuitry, causes the memory test logic circuitry to perform operations comprising:
evaluate a third set of memories included in the third power domain, and a third test data set in a third test data register based on a result of the evaluation of the second set of memories, the second test data register corresponding to the second power domain of the integrated circuit.

18. A method comprising:
defining, using one or more processors of a machine, a memory test logic including a first instruction set associated with a first power domain of an integrated circuit and a second instruction set associated with a second power domain of the integrated circuit, the integrated circuit including a memory test logic circuitry, the first instruction set, when executed by the memory test logic circuitry, causing the memory test logic circuitry to:
evaluate a first set of memories included in the first power domain, and store a first result data set in a first test data register (TDR) set based on a result of the evaluation, the first TDR set corresponding to the first power domain, and the second instruction set, when executed by the memory test logic circuitry, causing the memory test logic circuitry to:
evaluate a second set of memories included in the second power domain, and store a second result data set in a second TDR set based on a result of the evaluation of the second set of memories, the second TDR set corresponding to the second power domain of the integrated circuit; and inserting the memory test logic into the memory test logic circuitry of the integrated circuit.

19. The method of claim 18, wherein the memory test logic circuitry serially executes the first and second instruction sets such that the memory test logic circuitry evaluates the first and second set of memories in series.

20. The method of claim 18, wherein the first and second TDR sets are separate and distinct.

* * * * *